United States Patent
Rofougaran et al.

(10) Patent No.: US 8,135,340 B2
(45) Date of Patent: Mar. 13, 2012

(54) METHOD AND SYSTEM FOR A CONFIGURABLE FINITE IMPULSE RESPONSE FILTER USING A TRANSMISSION LINE AS A DELAY LINE

(75) Inventors: Ahmadreza Rofougaran, Newport Coast, CA (US); Maryam Rofougaran, Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 558 days.

(21) Appl. No.: 12/397,096

(22) Filed: Mar. 3, 2009

(65) Prior Publication Data
US 2010/0225422 A1    Sep. 9, 2010

(51) Int. Cl.
*H04B 7/24* (2006.01)
(52) U.S. Cl. ............ 455/39; 455/73
(58) Field of Classification Search ......... None
See application file for complete search history.

(56) References Cited

U.S. PATENT DOCUMENTS
2010/0285757 A1 * 11/2010 Rofougaran et al. ........... 455/77
* cited by examiner

*Primary Examiner* — An Luu
(74) *Attorney, Agent, or Firm* — Farjami & Farjami LLP

(57) ABSTRACT

Methods and systems for a configurable finite impulse response (FIR) filter using a transmission line as a delay line are disclosed and may include selectively coupling one or more taps of a multi-tap transmission line to configure delays for one or more finite impulse response (FIR) filters to enable transmission and/or reception of signals. The delays may be configured based on a location of the one or more selectively coupled taps on the multi-tap transmission line. The FIR filters, which may include one or more stages, may be impedance matched to the selectively coupled taps. The multi-tap transmission line may be integrated on the chip, or a package to which the chip is coupled. The multi-tap transmission line may include a microstrip structure or a coplanar waveguide structure, and may include ferromagnetic material. The distortion of signals in the chip may be compensated utilizing the FIR filters.

20 Claims, 6 Drawing Sheets

METHOD AND SYSTEM FOR A CONFIGURABLE FINITE IMPULSE RESPONSE FILTER USING A TRANSMISSION LINE AS A DELAY LINE

CROSS-REFERENCE TO RELATED APPLICATIONS/INCORPORATION BY REFERENCE

This application makes reference to:
U.S. patent application Ser. No. 12/367,892 filed on Feb. 9, 2009;
U.S. patent application Ser. No. 12/396,935 filed on even date herewith;
U.S. patent application Ser. No. 12/396,964 filed on even date herewith;
U.S. patent application Ser. No. 12/397,005 filed on even date herewith;
U.S. patent application Ser. No. 12/397,024 filed on even date herewith;
U.S. patent application Ser. No. 12/397,040 filed on even date herewith; and
U.S. patent application Ser. No. 12/397,060 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a configurable finite impulse response (FIR) filter using a transmission line as a delay line.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a configurable finite impulse response (FIR) filter using a transmission line as a delay line, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a configurable finite impulse response (FIR) filter using a transmission line as a delay line. Exemplary aspects of the invention may comprise selectively coupling one or more taps of a multi-tap transmission line to configure delays for one or more finite impulse response (FIR) filters to enable transmission of signals by the one or more of the plurality of transmitters and/or receiving of signals by said one or more of the plurality of receivers. The delays may be configured based on a location of the one or more selectively coupled taps on the multi-tap transmission line. The FIR filters may be impedance matched to the selectively coupled taps. The FIR filters may comprise one or more stages. The multi-tap transmission line may be integrated on the chip, or a package to which the chip is coupled. The multi-tap transmission line may comprise a microstrip structure or a coplanar waveguide structure, and may comprise ferromagnetic material. The distortion of signals in the chip may be compensated utilizing the FIR filters.

Figure 1:
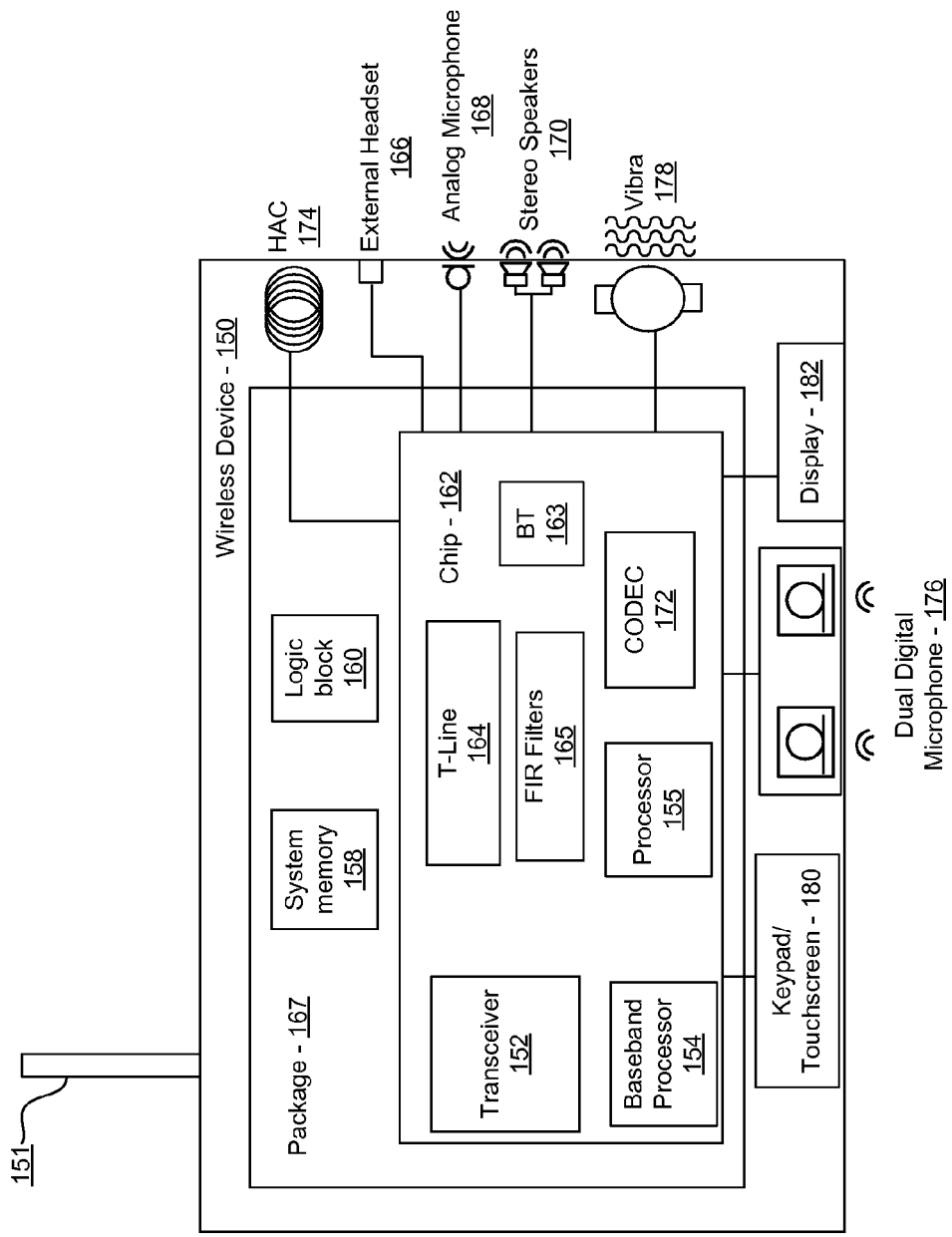
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, a multi-tap transmission line (T-Line) 164, a finite impulse response (FIR) filter 165, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceiver 152 may comprise suitable logic, circuitry, interfaces, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, LTE, 3GPP, UMTS, BLUETOOTH, and ZIGBEE, for example.

The baseband processor 154 may comprise suitable logic, circuitry, interfaces, and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interfaces, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interfaces, and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interfaces, and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interfaces, and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 Hz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 Hz and 16 Hz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma ($\Delta$-$\Sigma$) modulator, for example, to code digital output signals for analog processing.

The chip 162 may comprise an integrated circuit with multiple functional blocks integrated within, such as the transceiver 152, the processor 156, the baseband processor 154, the BT radio/processor 163, the FIR filters 165, the CODEC 172, and the multi-tap T-Line 164. The number of functional blocks integrated in the chip 162 is not limited to the number shown in FIG. 1. Accordingly, any number of blocks may be integrated on the chip 162 depending on chip space and wireless device 150 requirements, for example.

The multi-tap T-Line 164 may comprise conductive material deposited on and/or in the chip 162, and may also comprise a plurality of taps to enable configurable delays. In this manner, one or more FIR filters may utilize the multi-tap T-Line 164 as delay blocks. In an embodiment of the invention, the conductive material for the multi-tap T-Line 164 may comprise metal and/or ferromagnetic material, for example.

The FIR filters 165 may comprise suitable circuitry, logic, interfaces, and/or code that may be operable to compensate for the frequency response of a received signal processed by another component in the wireless device 150. For example, the FIR filters 165 may be utilized to compensate for distortion in the audio signal from output devices such as the stereo speakers 170 the external headset 166.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162 and other components of the wireless device 150. The package 167 may comprise an insulating material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The signals processed by the processor 155 and/or the baseband processor 154 may be communicated to and/or from devices that may distort the desired signals. Accordingly, the FIR filters 165 may be utilized to compensate for the undesired distortion. The multi-tap T-Line 164 may be utilized for delay blocks in the FIR filters 165 enabling plurality of delays, and thus enabling the FIR filters 165 to be configurable.

Figure 2:
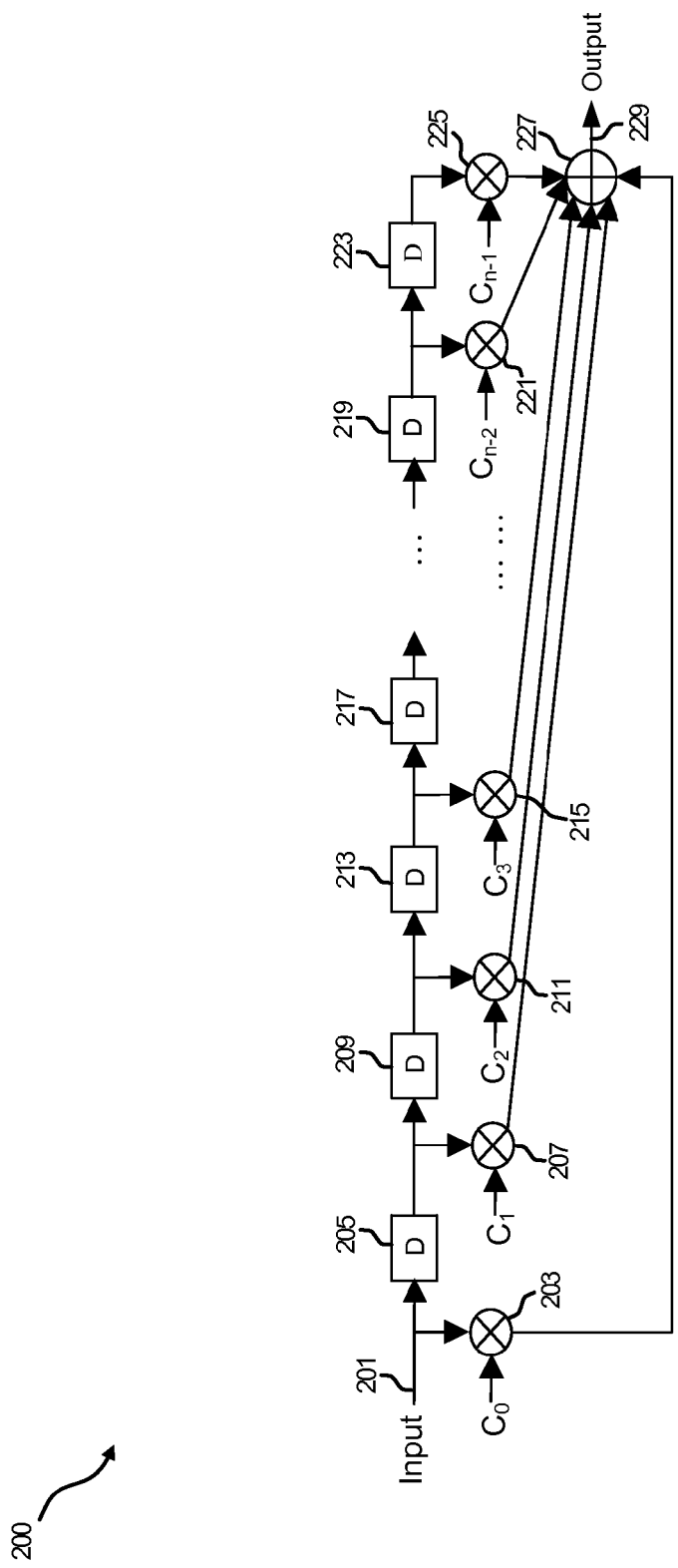
FIG. 2 is a block diagram illustrating an exemplary finite impulse response (FIR) filter, in accordance with an embodiment of the invention.

FIG. 2 is a block diagram illustrating an exemplary finite impulse response (FIR) filter, in accordance with an embodiment of the invention. Referring to FIG. 2, there is shown an FIR filter 200 that may comprise delay cells 205, 209, 213, 217, 219 and 223, multipliers 203, 207, 211, 215, 221 and 225, and an adder 227. The input signal 201 may be communicated to the multiplier 203 and the delay cell 205. The output of the delay cell 205 may be communicated to the delay cell 209 and also to the multiplier 207. The output of the delay cell 209 may be communicated to the delay cell 213 and to the multiplier 211. This operation may be repeated for a plurality of stages based on the filter design, such as 17, 33, or 65 stages, for example. The output of each multiplier 203, 207, 211, 215, 221 and 225 may be communicated to the adder 227. The output signal generated by the adder 227 may comprise the output signal 229.

In operation, the FIR filter 200 may perform frequency response compensation on an input signal 201, which may be utilized to compensate for distortion in the audio signal from output devices such as speakers or ear buds. The input signal 201 may be multiplied by coefficient $c_0$ at the multiplier 203 and then communicated to the adder 227. The input signal 201 may also be communicated to the delay cell 205. The output of the delay cell 205 may be communicated to the delay cell 209 and also may be multiplied by coefficient $c_1$ at the multiplier 207 and then communicated to the adder 227. This scheme may be repeated up to the number of stages, n, which may be 17, 33 or 65 for example, such that the output signal 229 may be a sum of the signals from each stage, where each stage may comprise the output of the previous stage through a delay cell, multiplied by a coefficient. The frequency response of the FIR compensation filter 200 may be determined by adjusting coefficients $c_0, c_1, c_2, \ldots c_{n-1}$, where n may be the number of stages in the filter, and by utilizing different delays in the delay blocks 205, 209, 213, 217, 219 and 223 that may utilize the multi-tap T-Line 164.

Figure 3A:
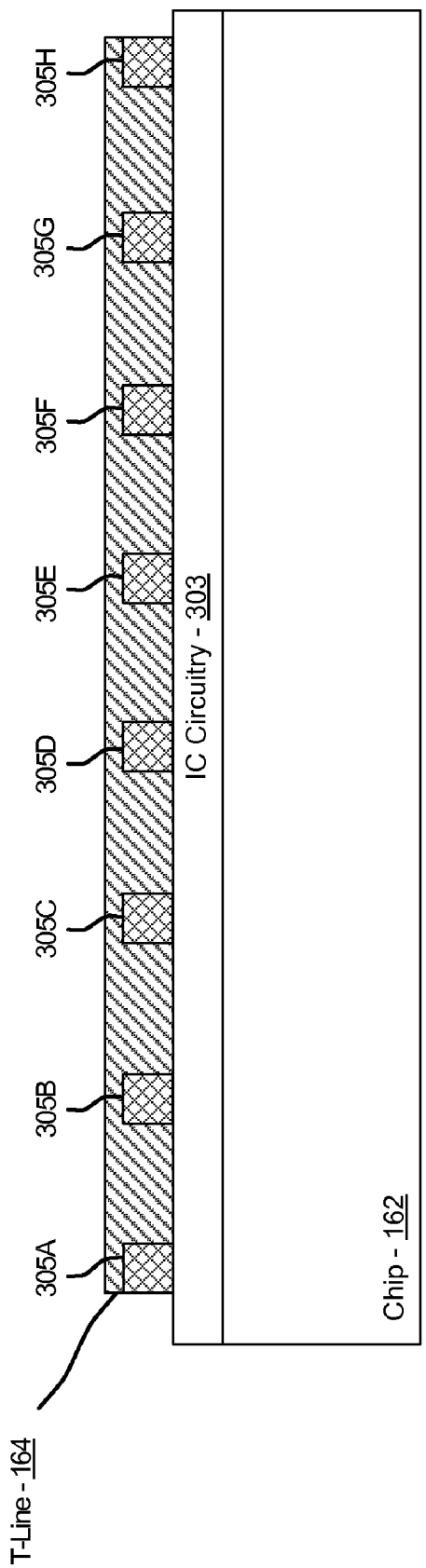
FIG. 3A is a diagram of an exemplary multi-port transmission line on a chip, in accordance with an embodiment of the invention.
Figure 3B:
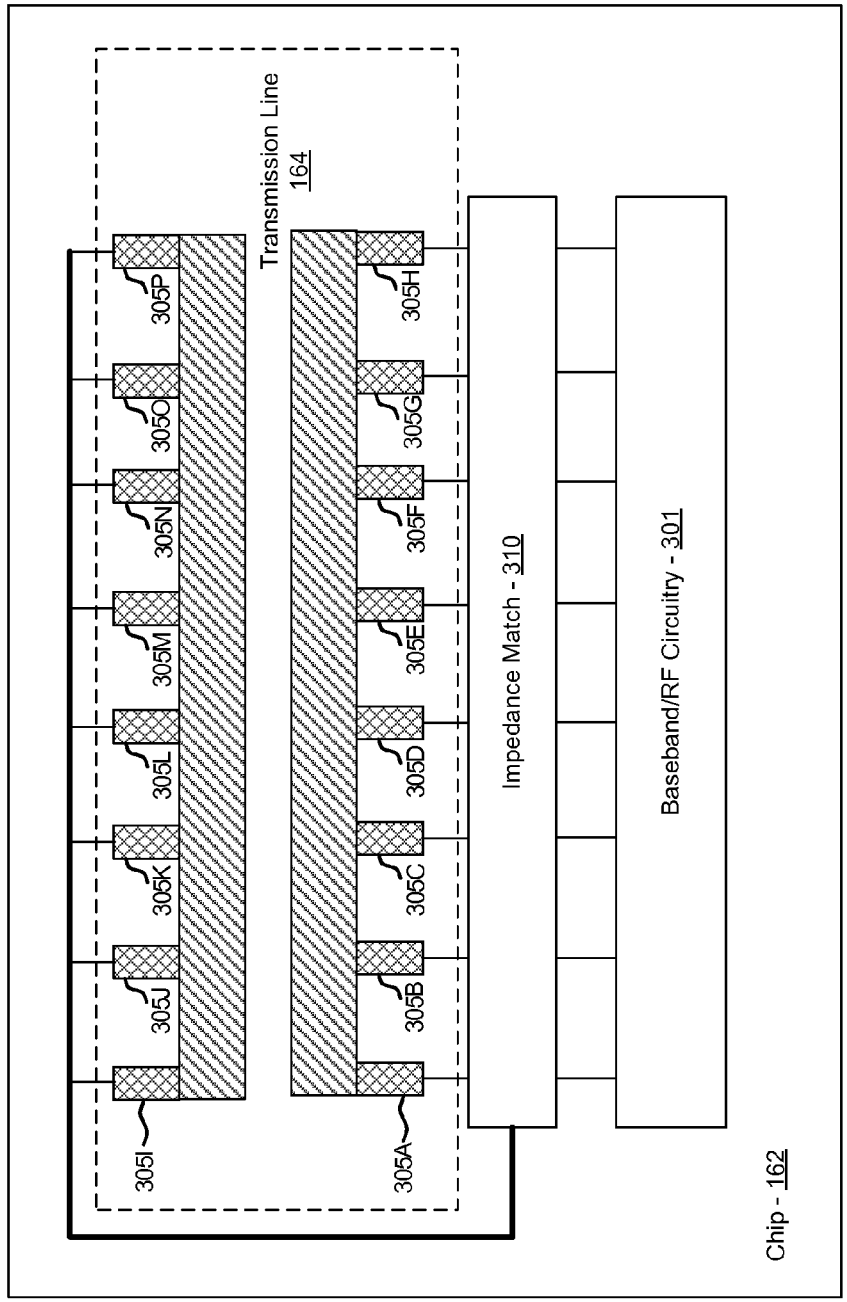
FIG. 3B is a diagram showing a top view of an exemplary multi-tap transmission line on a chip, in accordance with an embodiment of the invention.

FIG. 3A is a diagram of an exemplary multi-port transmission line on a chip, in accordance with an embodiment of the invention. Referring to FIG. 3A there is shown the multi-tap T-Line 164 on the chip 162, IC circuitry 203, and T-Line ports 305A-305P. The T-Line ports 305I-305P are not shown in FIG. 3A since they may be located on the side opposite to the T-Line ports 305A-305H, but are shown in FIG. 3B. The chip 162 may be as described with respect to FIG. 1. The IC circuitry 203 may comprise devices integrated in the chip 162, such as the transceiver 152, the FIR filters 155, the processor 156, and the baseband processor 154, for example. The chip 162 comprising the multi-tap T-Line 164 may be integrated with the wireless device 150.

The multi-tap T-Line 164 may comprise a microstrip and/or coplanar waveguide transmission line, for example, integrated in and/or on the chip 162 that may comprise a plurality of ports, the T-Line ports 305A-305P, such that FIR filters that may utilize delay cells, may be coupled to appropriate points along the multi-tap T-Line 164.

The T-Line ports 305A-305P may comprise electrical contacts along the length of the multi-tap T-Line 164 that may enable coupling to the T-Line at a plurality of points. In this manner, FIR filters, such as the FIR filters 165 and 200 described with respect to FIGS. 1 and 2, may be coupled to the multi-tap T-Line 164 where the delay at the particular tap may be matched to the desired delay for the FIR filter. The T-Line ports 305A-305P may comprise metal strips, for example, that may be electrically coupled to the multi-tap T-Line 164.

In operation, FIR filters utilized by the transceiver 152 may be coupled to the T-Line ports 305A-305P to enable a wide range of delay times. Thus, by integrating the multi-tap T-Line 164 on the chip 162 and enabling appropriate delay cells, the compensation of distortion of received signals in the wireless device 150 may be enabled, enhancing the performance of the wireless device 150.

FIG. 3B is a diagram showing a top view of an exemplary multi-tap transmission line on a chip, in accordance with an embodiment of the invention. Referring to FIG. 3B, there is shown the chip 162 comprising the multi-tap T-Line 164, baseband/RF circuitry 301, and an impedance match module 310.

The baseband/RF circuitry 301 may comprise suitable, circuitry, interfaces, logic, and/or code that may be operable to process baseband and RF signals. Baseband signals may be down-converted received RF signals, or may be generated by input devices such as microphones, for example. The baseband/RF circuitry 301 may comprise the transceiver 152, the baseband processor 154, the processor 156, the CODEC 172, and the BT radio/processor 163, for example, described with respect to FIG. 1. Accordingly, the baseband/RF circuitry 301 may comprise the FIR filters 165 and 200 described with respect to FIGS. 1 and 2.

The impedance matching module 310 may comprise suitable circuitry, logic, interfaces, and/or code that may be operable to impedance match the taps of the multi-tap T-Line 164 to the FIR filters 165 and 200 in the baseband/RF circuitry 301. The impedance matching module 310 may comprise capacitors, inductors, and/or resistors, for example. The impedance matching module 310 may also comprise switching capability, such as CMOS switches, for example, to couple the taps of the multi-tap T-Line 164 to different stages of the FIR filters 165 and 200. In another embodiment of the invention, one or more components of the impedance matching module 310 may be located external to the chip 162.

The number of taps 305A-305P is not limited to the number shown in FIGS. 3A and 3B. Accordingly, any number of ports and/or FIR filters may be utilized depending on the desired filtering characteristics, for example.

In operation, RF signals may be processed by the baseband/RF circuitry 301. The signal processing may comprise compensation of distortion in desired signals, and this compensation may be enabled by FIR filters. The FIR filters 165 and 200 may be coupled to delay cells of variable duration, and the duration may be configured by selecting appropriate taps of the multi-tap T-Line 164. The characteristic delay at each port may be a function of the position along the length of the multi-tap T-Line 164. In this manner, the wireless system 150 may communicate higher quality signals due to the configurable compensation capability of the FIR filters 165 and 200.

Figure 4:
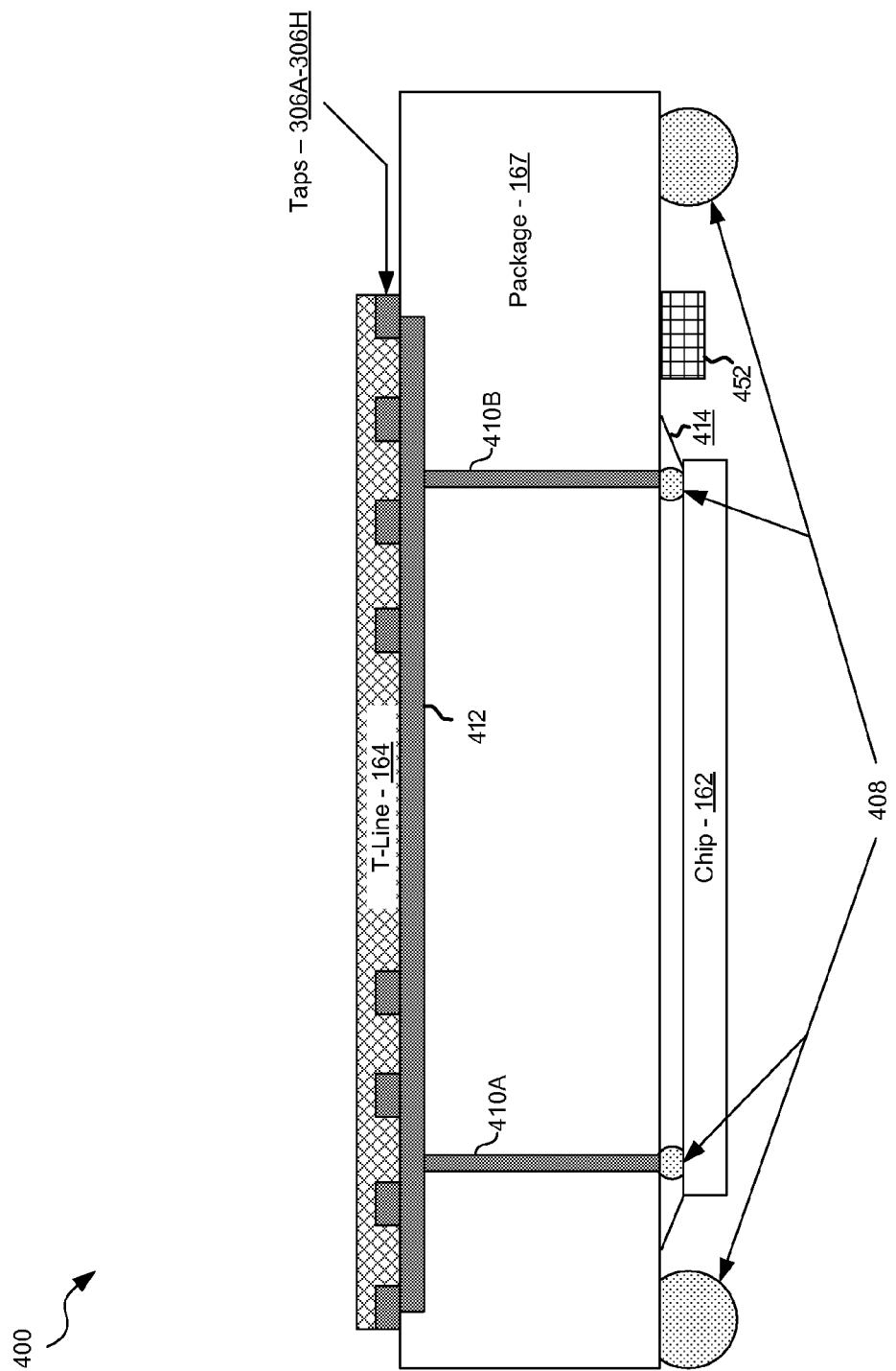
FIG. 4 is a diagram illustrating a cross sectional view of a multi-layer package with an integrated transmission line, in accordance with an embodiment of the invention.

FIG. 4 is a diagram illustrating a cross sectional view of a multi-layer package with an integrated transmission line, in accordance with an embodiment of the invention. Referring to FIG. 4, there is shown a hybrid circuit 400 comprising a package 167, the multi-tap T-Line 164, and the chip 162, which may comprise a single substrate. The package 167 may comprise insulating material and the vias 410A, and 410B. Additionally, in various embodiments of the invention, the package 167 may comprise one or more layers and/or areas of ferromagnetic and/or ferrimagnetic material. The chip 162 may be coupled to the package 167, and the package 167 to a PCB (not shown), via solder balls 408. A surface mount component 452 may be mounted to the package 167, and thermal epoxy 414 may be pressed between the chip 162 and the package 167.

The chip 162 may be as described with respect to, for example, FIGS. 1-3B. Additionally, the chip 162 may be bump-bonded or flip-chip bonded to the package 167 utilizing solder balls (e.g. solder balls 408). In this manner, wire bonds connecting the chip 162 to the package 167 may be eliminated, reducing and/or eliminating uncontrollable stray inductances due to wire bonds. In addition, the thermal conductance out of the chip 162 may be greatly improved utilizing the solder balls 408 and the thermal epoxy 214. The thermal epoxy 414 may be electrically insulating but thermally conductive to allow for thermal energy to be conducted out of the chip 162 to the much larger thermal mass of the package 167.

The solder balls 408 may comprise spherical balls of metal to provide electrical, thermal and physical contact between the chip 162 and the package 167. In making the contact with the solder balls 408, the chip 162 may be pressed with enough force to squash the metal spheres somewhat, and may be performed at an elevated temperature to provide suitable electrical resistance and physical bond strength. The solder balls 408 may also be utilized to provide electrical, thermal and physical contact between the package 167 and a printed circuit board comprising other parts of, for example, the wireless device 150 described with respect to, for example, FIG. 1.

The surface mount device 452 may comprise discrete circuit elements such as resistors, capacitors, inductors, and diodes, for example. The surface mount device 452 may be soldered to the package 167 to provide electrical contact. In various embodiments of the invention, additional surface mount elements or no surface mount elements may be coupled to the package 167.

The metal layer 412 may enable the electrical connection to the plurality of taps on the T-Line 164, and the vias 410A and 410B, which may each comprise a plurality of vias, may enable electrical coupling of the multi-tap T-Line 164 to the chip 162.

In an exemplary embodiment of the invention, the vias 410A and 410B may comprise metal and/or other conductive material(s) which may communicatively couple the multi-tap T-Line 164 to the solder balls 408. In this manner, signals may be conveyed to and/or from the chip 162 and the T-Line 164.

In operation, the chip 162 and associated package 167 may be utilized to transmit and/or receive RF signals. The chip 162 may be electrically coupled to the multi-tap T-Line 164 embedded on and/or integrated within the package 167. In this manner, configurable delay cells may be coupled to the FIR filters 165 and 200 described with respect to FIGS. 1 and 2.

In various embodiments of the invention, additional devices, for example, capacitors, inductors, and/or resistors, may be integrated into the package 167 without deviating from the scope of the present invention.

Figure 5:
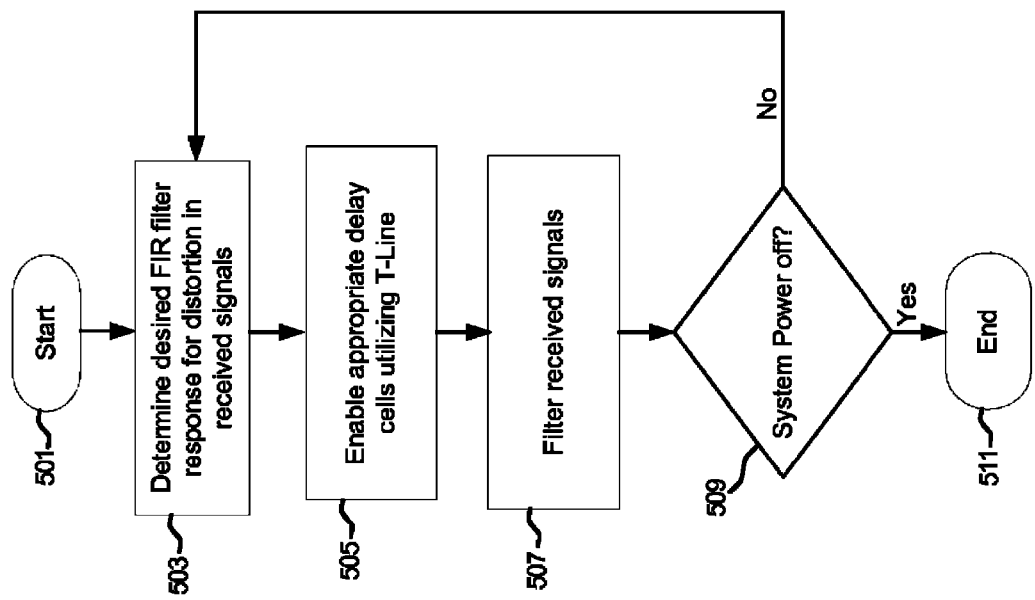
FIG. 5 is a block diagram illustrating exemplary steps for controlling the filtering of signals, in accordance with an embodiment of the invention.

FIG. 5 is a block diagram illustrating exemplary steps for controlling the filtering of signals, in accordance with an embodiment of the invention. Referring to FIG. 5, in step 503 after start step 501, the response of FIR filters 165 and 200 may be determined based on distortion in received signals. In step 505, the delays utilized for the determined FIR filter response may be enabled by coupling to appropriate taps of the multi-tap T-Line 164 via the impedance matching module 310, followed by step 507, where the distorted signals may be filtered. If, in step 509, the wireless device 150 is to be powered down, the exemplary steps may proceed to end step 511, but if not the exemplary steps may proceed back to step 503.

In an embodiment of the invention, a method and system are disclosed for selectively coupling one or more taps of a multi-tap transmission line 164 to configure delays 205, 209, 213, 217, 219, and 223 for one or more finite impulse response (FIR) filters 165 and 200 to enable transmission of signals by the one or more of the plurality of transmitters and/or receiving of signals by said one or more of the plurality of receivers. The delays 205, 209, 213, 217, 219, and 223 may be configured based on a location of the one or more selectively coupled taps 303A-303P on the multi-tap transmission line 164. The FIR filters 165 and 200 may be impedance matched to the selectively coupled taps 303A-303P. The FIR filters 165 and 200 may comprise one or more stages. The multi-tap transmission line 164 may be integrated on the chip 162, or a package 167 to which the chip 162 is coupled. The multi-tap transmission line 164 may comprise a microstrip structure or a coplanar waveguide structure, and may comprise ferromagnetic material. The distortion of signals in the chip 162 may be compensated utilizing the FIR filters 165 and 200.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a configurable finite impulse response (FIR) filter using a transmission line as a delay line.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling wireless communication, the method comprising:

in a chip comprising a plurality of transmitters and a plurality of receivers integrated on a single substrate, selectively coupling one or more taps of a multi-tap transmission line to configure delays for one or more finite impulse response (FIR) filters to enable transmission of signals by said one or more of said plurality of transmitters and/or receiving of signals by said one or more of said plurality of receivers.

2. The method according to claim 1, comprising configuring said delays based on a location of said one or more selectively coupled one or more taps on said multi-tap transmission line.

3. The method according to claim 1, comprising impedance matching said FIR filters to said selectively coupled one or more taps.

4. The method according to claim 1, wherein said one or more FIR filters comprise one or more stages.

5. The method according to claim 1, wherein said multi-tap transmission line is integrated on said chip.

6. The method according to claim 1, wherein said wherein said multi-tap transmission line is integrated on a package to which said chip is bonded.

7. The method according to claim 1, wherein said multi-tap transmission line comprises a microstrip.

8. The method according to claim 1, wherein said multi-tap transmission line comprises a coplanar waveguide.

9. The method according to claim 1, wherein said multi-tap transmission line comprises ferromagnetic material.

10. The method according to claim 1, comprising configuring said one or more finite impulse response filters to compensate for distortion of signals in said chip utilizing said FIR filters.

11. A system for enabling communication, the system comprising:
one or more circuits in a chip, said one or more circuits comprising one or more finite impulse response (FIR) filters, a plurality of transmitters, and a plurality of receivers, which are all integrated on a single substrate of said chip, wherein said one or more circuits are operable to selectively couple one or more taps of a multi-tap transmission line to configure delays for said one or more finite impulse response (FIR) filters to enable transmission of signals by said one or more of said plurality of transmitters and/or receiving of signals by said one or more of said plurality of receivers.

12. The system according to claim 11, wherein said one or more circuits are operable to configure said delays based on a location of said one or more selectively coupled one or more taps on said multi-tap transmission line.

13. The system according to claim 11, wherein said one or more circuits are operable to impedance match said FIR filters to said selectively coupled one or more taps.

14. The system according to claim 11, wherein said one or more FIR filters comprise one or more stages.

15. The system according to claim 11, wherein said multi-tap transmission line is integrated on said chip.

16. The system according to claim 11, wherein said multi-tap transmission line is integrated on a package to which said chip is bonded.

17. The system according to claim 11, wherein said multi-tap transmission line comprises a microstrip.

18. The system according to claim 11, wherein said multi-tap transmission line comprises a coplanar waveguide.

19. The system according to claim 11, wherein said multi-tap transmission line comprises ferromagnetic material.

20. The system according to claim 11, wherein said one or more circuits are operable to configure said one or more finite impulse response filters to compensate for distortion of signals in said chip utilizing said FIR filters.

* * * * *